United States Patent
Jeng

(10) Patent No.: US 7,235,848 B2
(45) Date of Patent: Jun. 26, 2007

(54) NONVOLATILE MEMORY WITH SPACER TRAPPING STRUCTURE

(75) Inventor: Erik S. Jeng, Taipei (TW)

(73) Assignee: Applied Intellectual Properties Co., Ltd., Taipei (TW)

( * ) Notice: Subject to any disclaimer, the term of this patent is extended or adjusted under 35 U.S.C. 154(b) by 0 days.

(21) Appl. No.: 10/731,517

(22) Filed: Dec. 9, 2003

(65) Prior Publication Data
US 2005/0121715 A1 Jun. 9, 2005

(51) Int. Cl.
*H01L 21/76* (2006.01)
(52) U.S. Cl. .................... 257/390; 324/311; 324/317; 324/E27.078
(58) Field of Classification Search ............. 257/390, 257/324, 311, 317, E27.078
See application file for complete search history.

(56) References Cited

U.S. PATENT DOCUMENTS

| | | | | |
|---|---|---|---|---|
| 5,573,965 A * | 11/1996 | Chen et al. | ................. | 438/297 |
| 5,847,428 A * | 12/1998 | Fulford et al. | ............... | 257/344 |
| 5,969,383 A * | 10/1999 | Chang et al. | ................ | 257/316 |
| 5,989,966 A * | 11/1999 | Huang | ........................ | 438/305 |
| 6,013,569 A * | 1/2000 | Lur et al. | .................... | 438/595 |
| 6,136,643 A * | 10/2000 | Jeng et al. | ................... | 438/253 |
| 6,235,598 B1 * | 5/2001 | Jan et al. | ..................... | 438/303 |
| 6,251,764 B1 * | 6/2001 | Pradeep et al. | ............. | 438/595 |
| 6,335,554 B1 * | 1/2002 | Yoshikawa | ................. | 257/316 |
| 6,348,387 B1 * | 2/2002 | Yu | ............................... | 438/303 |
| 6,555,865 B2 * | 4/2003 | Lee et al. | .................... | 257/314 |
| 6,559,500 B2 * | 5/2003 | Torii | .......................... | 257/315 |
| 6,720,631 B2 * | 4/2004 | Brigham et al. | ............ | 257/408 |
| 6,740,927 B1 * | 5/2004 | Jeng | ............................ | 257/315 |
| 6,762,085 B2 * | 7/2004 | Zheng et al. | ............... | 438/199 |
| 6,784,078 B2 * | 8/2004 | Kasuya | ....................... | 438/435 |
| 6,825,523 B2 * | 11/2004 | Caprara et al. | ............. | 257/314 |
| 2004/0113206 A1 * | 6/2004 | Chen et al. | .................. | 257/355 |

OTHER PUBLICATIONS

Jeng, Erik S. et al, "Investigation of Programming Charge Distribution in Nonoverlapped Implantation nMOSFETs", IEEE Trans. Electron Devices, vol. 53, No. 10, pp. 2517-2524, Oct. 2006).
Luksy, E. et al, "Investigation of channel hot electron injection by localized charge-trapping nonvolatile memory devices," IEEE Trans. Electron Devices, vol. 51, No. 3, pp. 444-451, Mar. 2004).
Makwana, Jitu J. et al, "A Nonvolatile Memory Overview". (website: http://aplawrence.com/Makwana/nonvolmem.html).

* cited by examiner

*Primary Examiner*—Eugene Lee
(74) *Attorney, Agent, or Firm*—Perkins Coie LLP

(57) ABSTRACT

The present invention discloses a nonvolatile memory with spacer trapping structure, the nonvolatile memory comprising a semiconductor substrate. A gate oxide is formed on the semiconductor substrate. A gate structure is formed on the gate oxide. An isolation layer is formed over the sidewall of the gate structure. First spacers are formed on the sidewall of the isolation layer and becoming the spacer trapping structure for storing carrier. And the p-n junctions of source and drain regions are formed adjacent to the gate structure. Silicide is formed on the gate structure and the source and drain regions.

20 Claims, 6 Drawing Sheets

NONVOLATILE MEMORY WITH SPACER TRAPPING STRUCTURE

TECHNICAL FIELD

The present invention relates to a semiconductor device, and more specifically, to a nonvolatile memory with spacer structure capable of trapping carriers.

BACKGROUND

The semiconductor industry has been advanced to the field of Ultra Large Scale Integrated Circuit (ULSI) technologies. The fabrication of the nonvolatile memories also follows the trend of the reduction in the size of a device. The nonvolatile memories include various types of devices. Different types of devices have been developed for specific applications' requirements in each of these segments. Flash memory is one of the segments of nonvolatile memory devices. The device includes a floating gate to storage charges and an element for electrically placing charge in and removing the charges from the floating gate. One of the applications of flash memory is BIOS for computers. Typically, the high-density nonvolatile memories can be applied as the mass storage of portable handy terminals, solid-state camera and PC cards. It is because that the nonvolatile memories exhibit many advantages, such as memory retention without power, fast access time, low power dissipation in operation, and robustness.

The formation of nonvolatile memories toward the trends of low supply power and fast access, because these requirements are necessary for the application of the mobile computing system. Nonvolatile memory needs the charges to be hold in the floating gate for a long period of time. Therefore, the dielectric that is used for insulating the floating gate needs to be high quality in insulation and good durability in writing. At present, the flash memories use tunneling effect or hot carrier effect to charging or discharging the floating gate. As known in the art, the tunneling effect is a basic technology in charging or discharging. In order to attain high tunneling efficiency, the thickness of the dielectric between the floating gate and substrate have to be scaled down due to the supply voltage is reduced. A high voltage is applied to a control gate to induce a high electric field in a tunnel oxide layer, and electrons of a semiconductor substrate pass the tunnel oxide layer and are injected into a floating gate. During the mode of erasing, the bias may apply on the source to discharge the electron from the floating gate to the source of a memory device.

Currently, the SOC (system on chip) desires memory with high operation speed and integrated in one single chip. For example, the single polysilicon processing may integrate with other devices such as transistors. The typical nonvolatile memory employs stack gate memories by double polysilicon processing. One type of the memories uses trapping layer instead of floating gate (FG) to hold the carrier. The memory cells are constructed with a trapping ONO layer. A nitride layer sandwiched between two oxide layers and a polycrystalline layer. To program or write the cell, voltages are applied to the drain and the gate and the source is grounded. These voltages generate an electric field along the length of the channel from the source to the drain. This electric field causes electrons to be drawn off the source and begin accelerating towards the drain. The hot electrons are generated at the boundary between drain and channel during the acceleration.

In the prior art, please refer to U.S. Pat. No. 4,881,108, U.S. Pat. No. 5,768,192 to Eitan B. entitled "Non-volatile semiconductor memory cell utilizing asymmetrical charge trapping", filed on 16 Jun. 1998. The charge trapping memory may also be referred to U.S. Pat. No. 6,335,554 to Yoshikawau and Kuniyoshi, entitled "Semiconductor Memory". The patent disclosed a memory with ONO structure. Further article teaches the memory with ONO stacked layer could also be found, please refer to the article, Chan, T. Y. et al, "A True Single-Transistor Oxide-Nitride-Oxide EEPROM Device," IEEE Electron Device Letters, vol. EDL-8. No. 3, March 1987.

SUMMARY

The object of the present invention is to disclose a nonvolatile memory with spacer structure capable of trapping carriers.

The present invention discloses a nonvolatile memory with spacer trapping structure, the nonvolatile memory comprising a semiconductor substrate. A gate oxide is formed on the semiconductor substrate. A gate structure is formed on the gate oxide. An isolation layer is formed on the sidewall of the gate structure. First spacers are formed on the sidewall of the isolation layer for storing carriers and source and drain regions formed adjacent to the gate structure. And the p-n junctions of source and drain regions are located under the spacer structure. Salicide is formed on the gate structure and the source and drain regions.

The nonvolatile memory further comprises pocket ion implantation region located adjacent to the source and drain regions and under the spacer structure, wherein the conductive type of the pocket ion implantation region is opposite to the one of the source and drain regions. Alternatively, the nonvolatile memory further includes lightly doped drain region adjacent to the source and drain regions, wherein the junction of the lightly doped drain region is under the spacer structure and shallower than the one of the source and drain regions and the lightly doped drain region is closer to the channel under the gate structure than the source and drain regions; and pocket ion implantation region adjacent to the source and drain regions, wherein the conductive type of the pocket ion implantation region is opposite to the one of the source and drain regions. Further embodiment, the nonvolatile memory further comprises double doped drain region adjacent to the source and drain regions, wherein the junction of the double doped drain region is under the spacer structure and deeper than the one of the source and drain regions and the double doped drain region is closer to the channel under the gate structure than the source and drain regions; and pocket ion implantation region adjacent to the double doped drain region and under the undercut structure, wherein the conductive type of the pocket ion implantation region is opposite to the one of the source and drain regions.

The first spacer includes nitride or the materials having energy gap lower than 6 eV. The present invention may further include second spacers attached on the first spacers, wherein the second spacers are formed of oxide or the material having energy gap larger than 7 eV. The isolation layer is formed of oxide or the material having energy gap larger than 7 eV. Wherein the silicide material includes $TiSi_2$, WSi2, $CoSi_2$ or NiSi.

The present invention discloses a nonvolatile memory with spacer trapping structure, the nonvolatile memory comprising a semiconductor substrate; a gate oxide formed on the semiconductor substrate. A gate structure is formed on the gate oxide, wherein the gate structure comprises a stacked structure including polysilicon layer/silicide layer and a first dielectric layer. A second dielectric layer is formed over the sidewall of the gate structure. First spacers are formed on the sidewall of the second dielectric layer for storing carrier and source and drain regions formed adjacent to the gate structure. And the p-n junctions of source and drain regions are located under the spacer structure.

The present invention further comprises pocket ion implantation region located adjacent to the source and drain regions and under the spacer structure, wherein the conductive type of the pocket ion implantation region is opposite to the one of the source and drain regions. Alternatively, the nonvolatile memory further comprises lightly doped drain region adjacent to the source and drain regions, wherein the junction of the lightly doped drain region is under the spacer structure and shallower than the one of the source and drain regions and the light doped drain region is closer to the channel under the gate structure than the source and drain regions; and pocket ion implantation region adjacent to the source and drain regions, wherein the conductive type of the pocket ion implantation region is opposite to the one of the source and drain regions. In another preferred embodiment, the present invention further comprises double doped drain region adjacent to the source and drain regions, wherein the junction of the double doped drain region is under the spacer structure and deeper than the one of the source and drain regions and the double doped drain region is closer to the channel under the gate structure than the source and drain regions; and pocket ion implantation region adjacent to the double doped drain region and under the spacer structure, wherein the conductive type of the pocket ion implantation region is opposite to the one of the source and drain regions.

Wherein the first spacer includes nitride or the material has energy gap lower than 6 eV. The nonvolatile memory may further comprise second spacers attached on the first spacers, wherein the second spacers are formed of oxide or the material having energy gap larger than 7 eV. The second dielectric layer later is formed of oxide or the material having energy gap larger than 7 eV. The first spacers are formed of nitride or the material having energy gap lower than 6 eV. The silicide material includes $TiSi_2$, $CoSi_2$ or NiSi. Further, the first dielectric layer is formed of oxide or nitride or the combination of oxide and nitride layers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
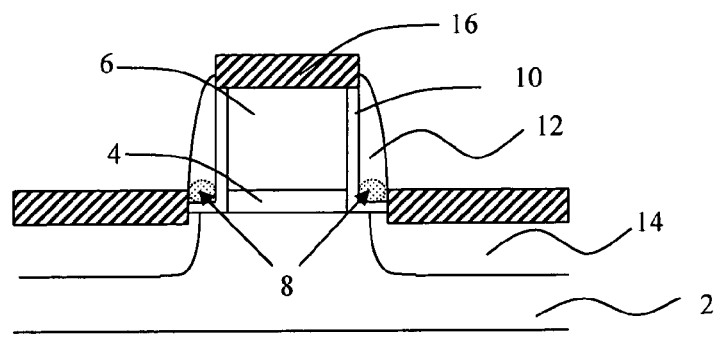
FIG. 1 is a cross sectional view of a semiconductor wafer illustrating the first embodiment according to the present invention.

The present invention proposes a novel structure for charge trapping nonvolatile memory. In the structure, the cell capacity for storing data can be increased by the cell structure. The detail description will be seen as follows. A semiconductor substrate is provided for the present invention. In a preferred embodiment, as shown in the FIG. 1, a single crystal silicon substrate 2 with a <100> or <111> crystallographic orientation is provided. The substrate 2 includes a pattern of active areas. The isolation to separate the devices includes STI or FOX. A thin dielectric layer 4 consisted of silicon dioxide is formed on the substrate 2 to act as gate oxide. Typically, the layer 4 can be grown in oxygen ambient at a temperature of about 700 to 1100 degrees centigrade. Other method, such as chemical vapor deposition, can also form the oxide. In the embodiment, the thickness of the silicon dioxide layer 4 is approximately 15–250 angstroms. Subsequently, a conductive layer 6 is formed on the layer 4. The conductive layer 46 may be formed of doped polysilicon, in-situ doped polysilicon or epitaxy silicon. For an embodiment, the doped polysilicon layer 6 is doped by phosphorus using a $PH_3$ source. A photo-resist defined patterning process is used on the conductive layer 6, thereby forming the gate structure on the silicon substrate 2. It has to be noted that the gate structure includes a charge trapping region 8 located at lower portion of the spacer 12 adjacent to the gate 6. Please refer to FIG. 1, an isolation layer 10 is conformally formed on the substrate 2 and the gate structure 6. The material for forming the isolation layer 10 can be oxide ($SiO_2$) or ($HfO_2$) or the material with energy gap higher than 7 eV. One suitable method for the oxide layer 10 includes thermal oxidation and deposition by CVD. For example, Low Pressure Chemical Vapor Deposition (LPCVD), Plasma Enhance Chemical Vapor Deposition (PECVD), High Density Plasma Chemical Vapor Deposition (HDPCVD). Still referring to FIG. 1, an isotropic etching is performed to create sidewall spacers 12 on the sidewall of the isolation layer 10. Reactive ion etching (RIE) or plasma etching is the typical way to achieve the purpose. The spacers 12 includes the charge trapping region 8, thereby forming the ON structure capable of trapping carriers to define the digital states. The material for the spacer could be nitride or the material with energy gap smaller than 6 eV. In the preferred embodiment, the reaction gases of the step to form silicon nitride layer include, for example, SiH4, NH3N2, N2O or SiH2Cl2, NH3N2, N2O Turning to FIG. 1, the p-n junction of source and drain region 14 is formed by performing an ion implantation to dope ions into the substrate 2 using the gate structure 6 and sidewall spacers 12 as a mask. After selectively etching isolation layer 10, portions of the gate 6 and substrate 2 are exposed. Silicide 16 is introduced on the exposed surface of the top portion of gate and the silicon substrate 2 on the source and drain regions 14 to reduce their resistance. Preferably, the silicide 16 can be $TiSi_2$, $WSi_2$, $CoSi_2$ or NiSi. The gate structure 6 acts as the control gate, and the nitride spacers are used to trap carriers. The spacers 12 are used to store charges, thereby defining the digital states including (0, 0), (0,1), (1, 0), (1, 1). A sectional view of a multi-bit nonvolatile memory cell in accordance with the present invention is shown in FIG. 1-24. The memory cell includes a substrate 2 having at least two buried PN junctions, one is the left junction and the other is the right junction. Channels are located between the two junctions during operation. Above the main channel is an oxide 4, on top of the oxide layer 4 is a control gate 6. Spacer 12 is used for charge trapping and is preferably comprised of silicon nitride. The hot electrons or holes are trapped as they are injected into the Spacer 12. The stack structure including the spacer 12 and the isolation layer 10 refers to the spacer trapping structure, as shown in FIG. 1.

The memory cell is capable of storing two bits of data, a right bit and a left bit. The two bit memory cell is a symmetrical device. The left junction serves as the source terminal and the right junction serves as the drain terminal for the right bit programming. Similarly, for the left bit programming, the right junction serves as the source terminal and the left junction serves as the drain terminal. When the distinction between left and right bits is not crucial to the particular discussion, the terms source and drain are utilized as conventional manner.

Figure 2:
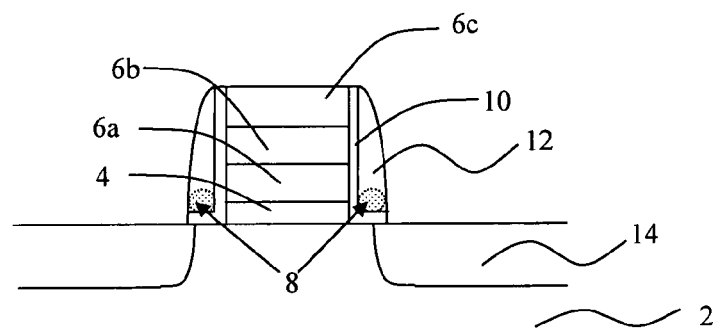
FIG. 2 is a cross sectional view of a semiconductor wafer illustrating the second embodiment according to the present invention.

FIG. 2 illustrates the second embodiment of the present invention. Most of the parts are similar to the first embodiment, the difference between both includes that the example omits the salicide 16 at source and drain regions in the second embodiment. The gate is consisted of polysilicon 6a, silicide 6b and dielectric layer 6c. The silicide 6b is preferably formed of $TiSi_2$, $WSi_2$, $CoSi_2$ or NiSi. The dielectric layer 6c is formed of oxide, nitride or the combinations of oxide and nitride layers. The portion 8 of the trapping spacer 12 is used to trapping charge.

Figure 3:
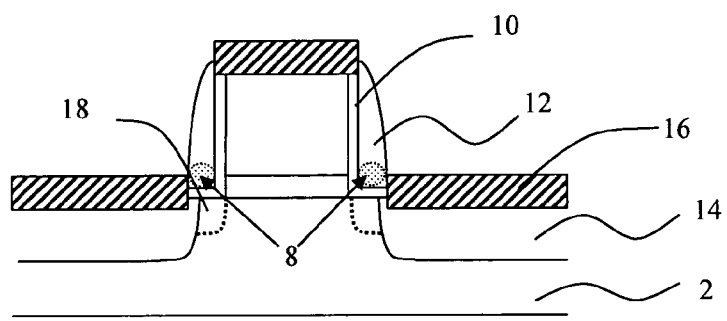
FIG. 3 is a cross sectional view of a semiconductor wafer illustrating the third embodiment according to the present invention.
Figure 4:
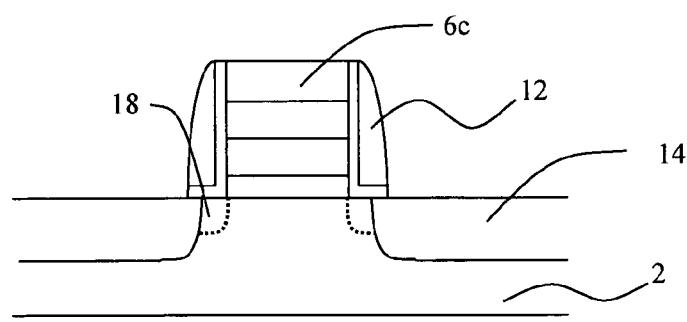
FIG. 4 is a cross sectional view of a semiconductor wafer illustrating the forth embodiment according to the present invention.

Turning to FIG. 3, the embodiment includes pocket ion implantation region 18 adjacent to the source and drain region 14 and adjacent to the gate structure to reduce the short channel effect and increase the efficiency of the hot carrier injection. FIG. 4 shows the alternative example for the present invention, it is similar to the second embodiment. It also includes pocket ion implantation region 18 adjacent to the source and drain region 14. The conductive type of the pocket implant region 18 is opposite to the one of the source and drain region 14.

Figure 5:
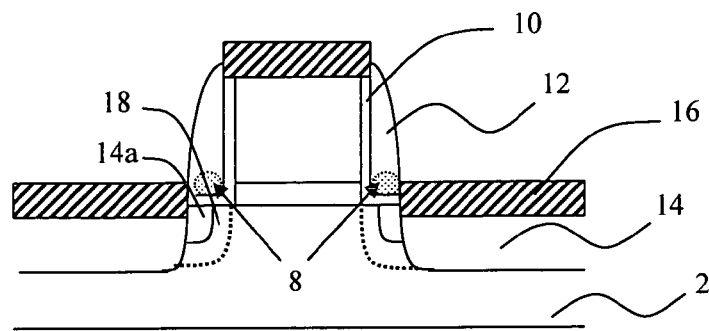
FIG. 5 is a cross sectional view of a semiconductor wafer illustrating the fifth embodiment according to the present invention.
Figure 6:
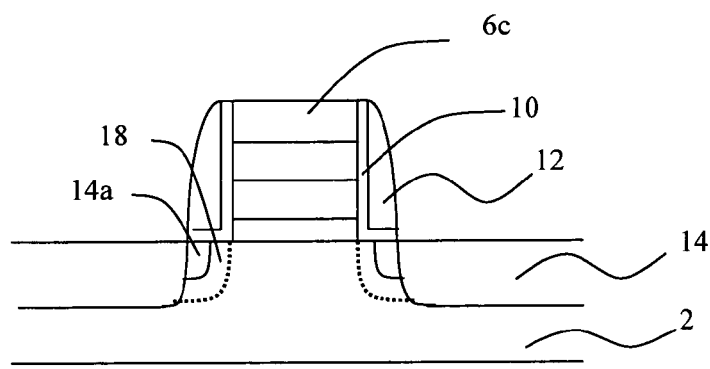
FIG. 6 is a cross sectional view of a semiconductor wafer illustrating the sixth embodiment according to the present invention.
Figure 7:
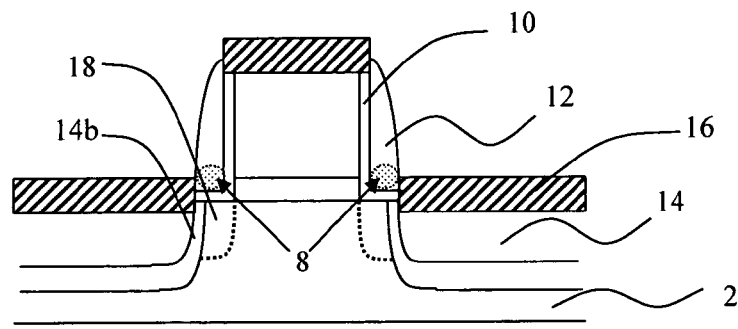
FIG. 7 is a cross sectional view of a semiconductor wafer illustrating the seventh embodiment according to the present invention.
Figure 8:
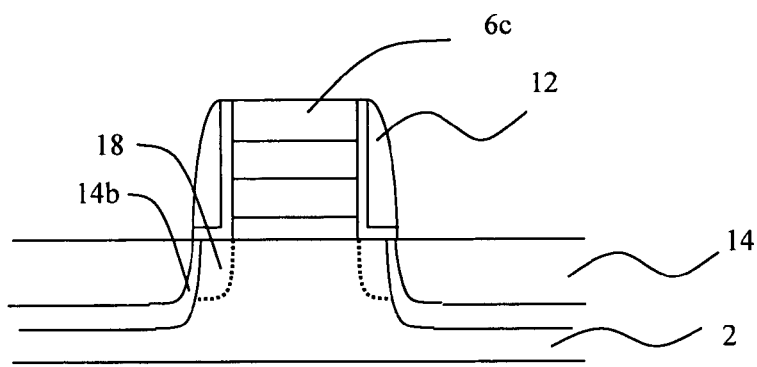
FIG. 8 is a cross sectional view of a semiconductor wafer illustrating the eighth embodiment according to the present invention.

FIGS. 5 and 6 are the alternative approaches with respect to the embodiments shown in FIGS. 3 and 4. The fifth and sixth embodiments introduce the lightly doped drain 14a to control the hot carriers and further comprise pocket ion implant region 18 adjacent to the source and drain region 14 and under the portion 8 of the charge trapping spacers 12. The conductive type of the pocket ion implantation region is opposite to the one of the source and drain region. The junction of the lightly doped drain is shallower than the one of the source and drain region. The lightly doped drain 14b is also closer to the channel under the gate. Alternatively, the other embodiments shown in FIGS. 7 and 8 introduce the usage of double diffused drain (DDD) structure to reduce the junction breakdown effect. The conductive ion type of the DDD structure is the same as that of the source and drain region. However, the junctions of the lightly doped regions are deeper than the junctions of the heavily doped source and drain region. The embodiments further comprise pocket ion implant region adjacent to the double diffused source and drain region and under the spacer structure 8 of the control gate 6.

Figure 9:
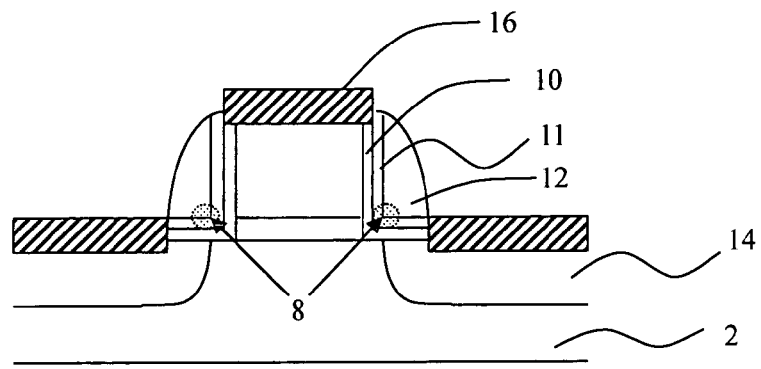
FIG. 9 is a cross sectional view of a semiconductor wafer illustrating the ninth embodiment according to the present invention.
Figure 10:
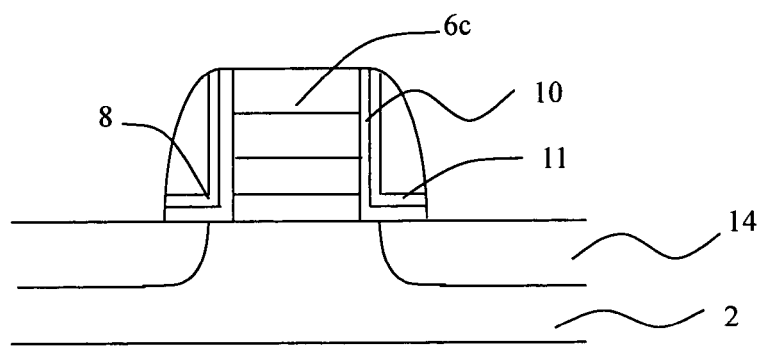
FIG. 10 is a cross sectional view of a semiconductor wafer illustrating the tenth embodiment according to the present invention.
Figure 11:
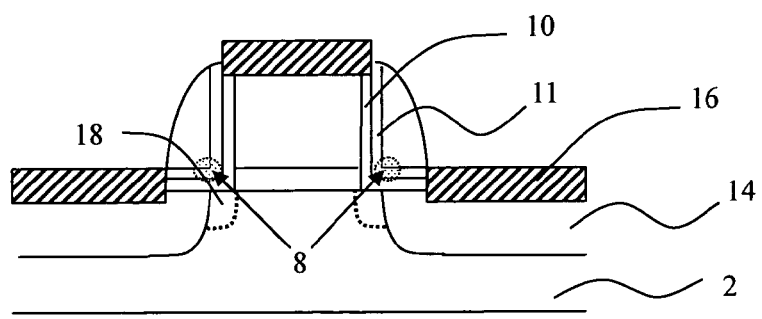
FIG. 11 is a cross sectional view of a semiconductor wafer illustrating the eleventh embodiment according to the present invention.
Figure 12:
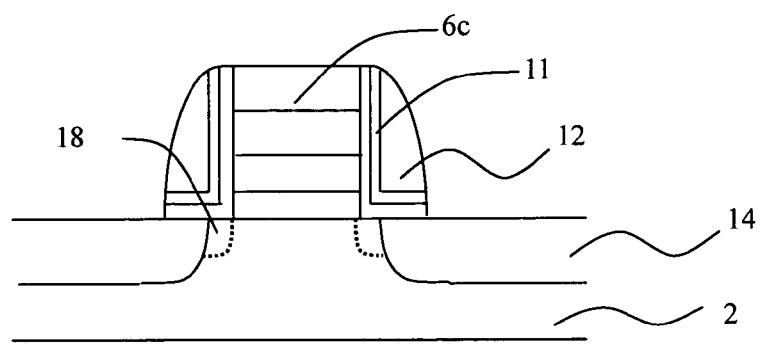
FIG. 12 is a cross sectional view of a semiconductor wafer illustrating the twelfth embodiment according to the present invention.
Figure 13:
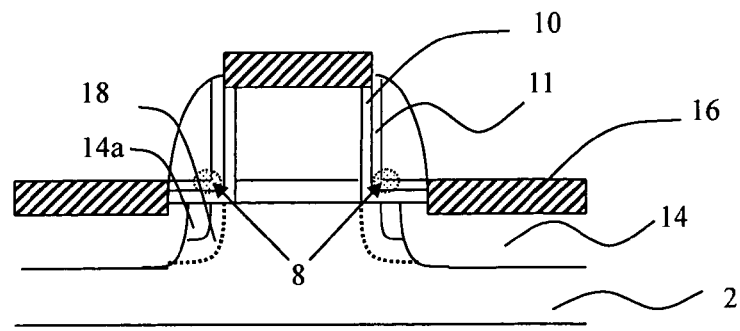
FIG. 13 is a cross sectional view of a semiconductor wafer illustrating the thirteenth embodiment according to the present invention.
Figure 14:
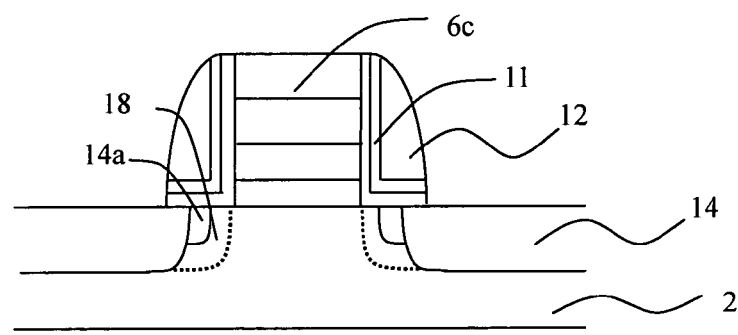
FIG. 14 is a cross sectional view of a semiconductor wafer illustrating the fourteenth embodiment according to the present invention.
Figure 15:
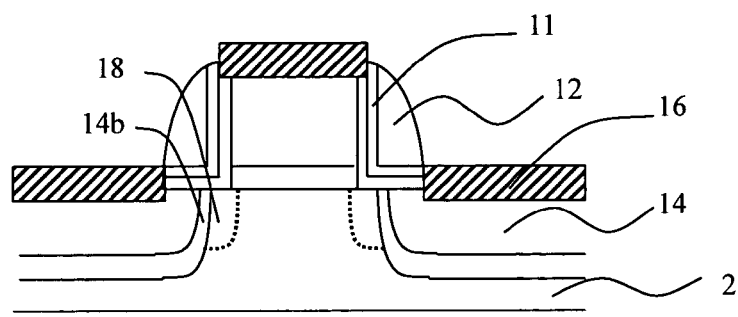
FIG. 15 is a cross sectional view of a semiconductor wafer illustrating the fifteenth embodiment according to the present invention.
Figure 16:
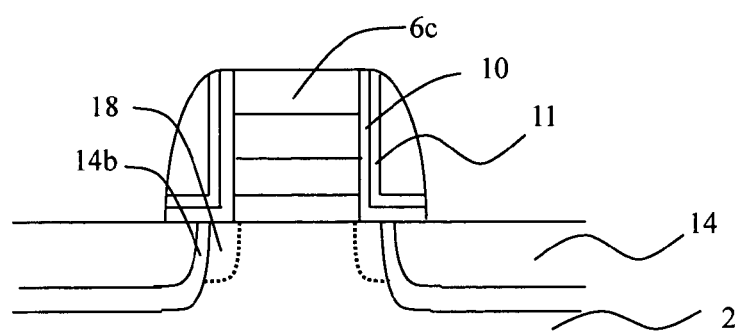
FIG. 16 is a cross sectional view of a semiconductor wafer illustrating the sixteenth embodiment according to the present invention.
Figure 17:
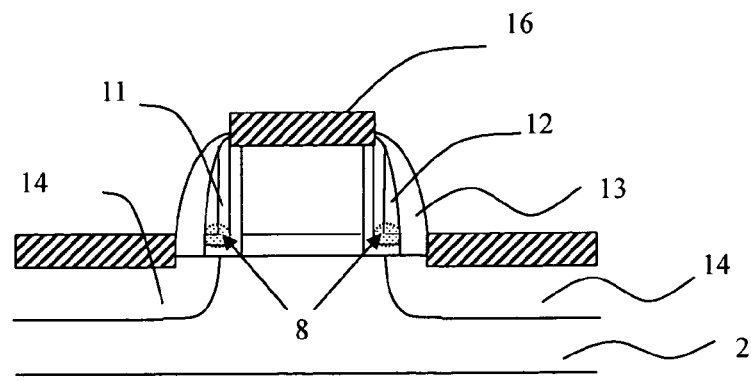
FIG. 17 is a cross sectional view of a semiconductor wafer illustrating the seventeenth embodiment according to the present invention.
Figure 18:
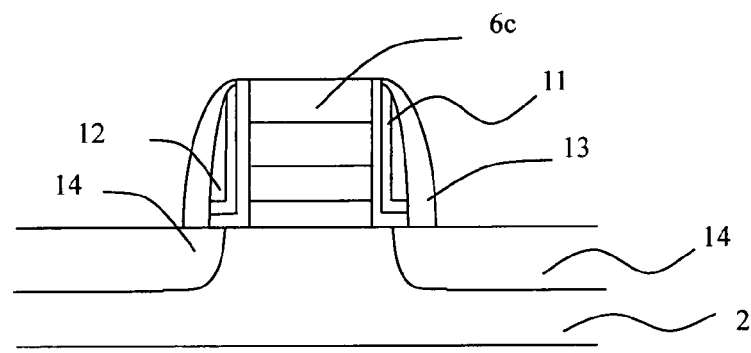
FIG. 18 is a cross sectional view of a semiconductor wafer illustrating the eighteenth embodiment according to the present invention.
Figure 19:
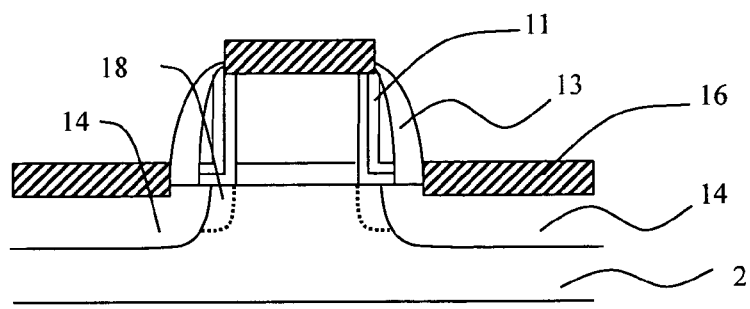
FIG. 19 is a cross sectional view of a semiconductor wafer illustrating the nineteenth embodiment according to the present invention.
Figure 20:
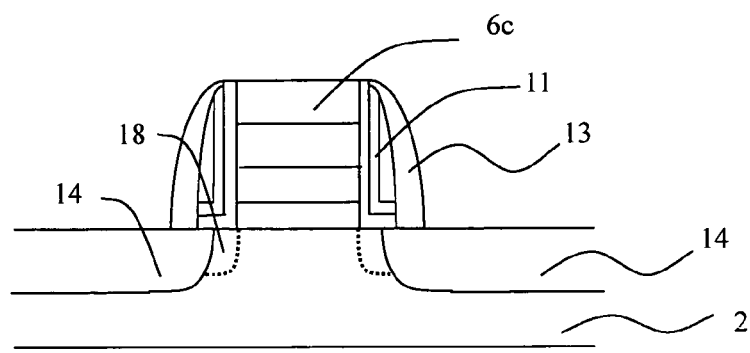
FIG. 20 is a cross sectional view of a semiconductor wafer illustrating the twentieth embodiment according to the present invention.
Figure 21:
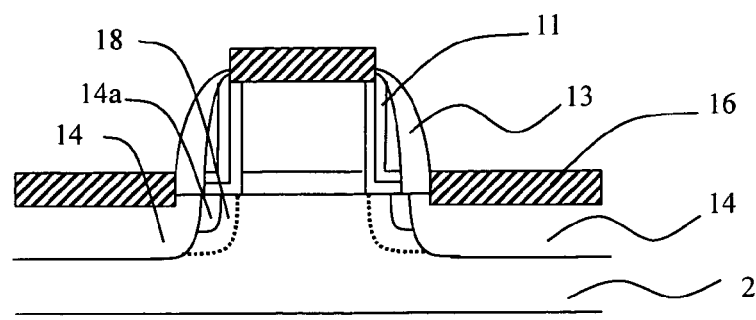
FIG. 21 is a cross sectional view of a semiconductor wafer illustrating the twenty-first embodiment according to the present invention.
Figure 22:
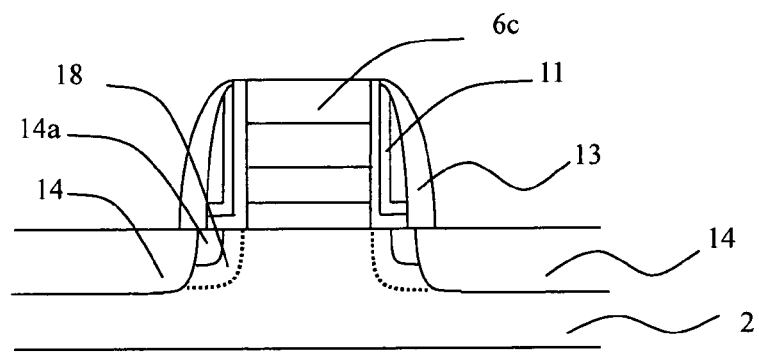
FIG. 22 is a cross sectional view of a semiconductor wafer illustrating the twenty-second embodiment according to the present invention.
Figure 23:
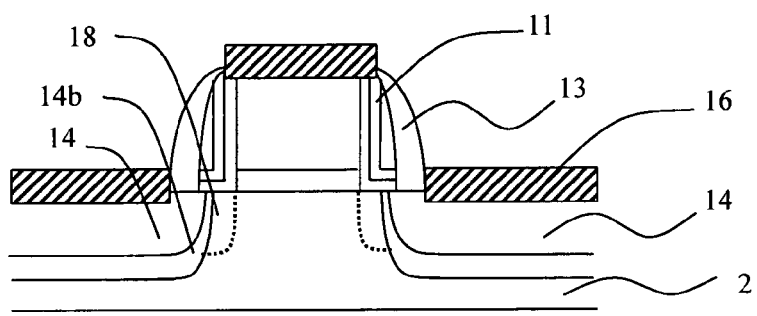
FIG. 23 is a cross sectional view of a semiconductor wafer illustrating the twenty-third embodiment according to the present invention.
Figure 24:
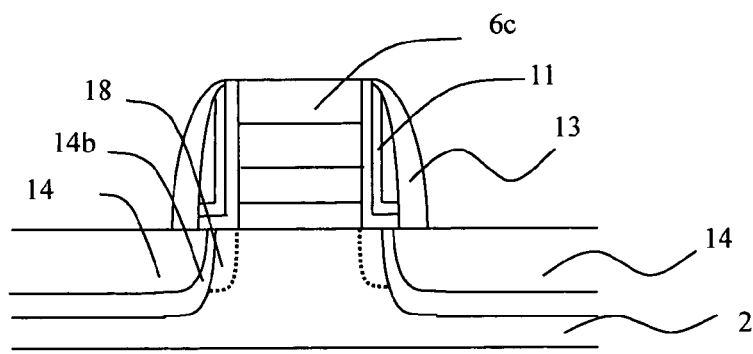
FIG. 24 is a cross sectional view of a semiconductor wafer illustrating the twenty-fourth embodiment according to the present invention.

Please refer to FIG. 9, the example is similar to the first embodiment except the spacer 12 is formed of oxide and in the ninth embodiment, there are double isolation layers formed on the gate structure 6 prior to the formation of the oxide spacer 12. The first isolation layer 10 is formed of oxide or the material with energy gap greater than 7 eV, and the second one 11 is formed of nitride or the material with energy gap smaller than 6 eV. Similarly, the preferred embodiments from FIG. 10-16 are the alternative solutions for the corresponding examples from FIG. 2-8. The spacers 12 are formed of oxide and the corresponding structures, features are very similar to those corresponding examples. The charge is also trapped by the nitride trapping layer. Therefore, the description is omitted.

Next, the embodiments shown in FIGS. 17–24 are the alternative arrangements that are associated with FIGS. 9–16, correspondingly. The main different is that the double-spacers structure is introduced into the embodiments shown in FIGS. 17–24. The material for the first spacer 12 is oxide. The ONO structure is consisted of the oxide layer 10, nitride layer 11 and the oxide spacer 12. The second spacer 13 is attached on the first spacer 12, the second spacer can be formed of oxide, nitride or the material having energy gap larger than 4 eV. The configuration, therefore, constructs the double spacers structure.

In the illustrations of the present invention, form the direction parallel to the surface of the paper, two spacers are located adjacent to the gate, hence, two-bits may be stored in the two nitride spacers, and other two bits could be stored in the two further nitride spacers, the two nitride spacers (not shown in the figures) could be observed from the direction perpendicular to the surface of the paper. Therefore, the present invention provides a multi-bit device for storing multi-bits digital signal. The trapping layer is formed of ONO or ON configuration to trap the carrier, thereby defining the digital states.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures. While the preferred embodiment of the invention has been illustrated and described, it will be appreciated that various changes can be made therein without departing from the spirit and scope of the invention.

I claim:

1. A nonvolatile memory with spacer trapping structure, said nonvolatile memory comprising:
   a semiconductor substrate;
   a gate oxide formed on said semiconductor substrate;
   a control gate structure formed on said gate oxide;
   spacer trapping structures including a first isolation layer formed on the sidewalls of said control gate structure and dielectric spacers formed on said first isolation layer, wherein said spacer trapping structures includes charge trapping capability thereby storing multiple bits of data in multiple trapping sites to achieve multiple status within one single cell;
   source and drain regions formed adjacent to said control gate structure, wherein p-n junctions of said source and drain regions formed under said spacer trapping structure; and
   silicide formed on said control gate structure and said source and drain regions.

2. The nonvolatile memory of claim 1, further comprising pocket ion implantation region located adjacent to said source and drain regions, wherein the conductive type of the pocket ion implantation region is opposite to the one of the source and drain regions, wherein the p-n junctions of said pocket ion implantation region formed under said spacer trapping structure.

3. The nonvolatile memory of claim 2, wherein said spacer trapping structure further comprises a second isolation layer formed between said first isolation layer and said dielectric spacer, said second isolation layer being formed of nitride or the material having energy gap lower than 6 eV, wherein said first isolation layer including oxide or the material having energy gap greater than 7 eV, said dielectric spacer attached onto the sidewall of said second isolation layer are formed of oxide or the material having energy gap larger than 7 eV.

4. The nonvolatile memory of claim 2, wherein said first isolation layer is formed of oxide or the material having energy gap larger than 7 eV.

5. The nonvolatile memory of claim 2, wherein said dielectric spacer is formed of nitride or the material having energy gap lower than 6 eV.

6. The nonvolatile memory of claim 2, wherein said silicide material includes $TiSi_2$, $CoSi_2$ or NiSi.

7. The nonvolatile memory of claim 1, further comprising:
   lightly doped drain region adjacent to said source and drain regions, wherein p-n junctions of said lightly doped drain regions formed under said spacer trapping structure and the p-n junction of said lightly doped drain region is shallower than the one of said source and drain regions and said lightly doped drain region is closer to the channel under said gate structure than said source and drain regions; and
   pocket ion implantation region adjacent to said lightly doped drain regions, wherein the conductive type of the pocket ion implantation region is opposite to the one of the source and drain regions.

8. The nonvolatile memory of claim 7, wherein said spacer trapping structure further comprises a second isolation layer formed between said first isolation layer and said dielectric spacer, said second isolation layer being formed of nitride or the material having energy gap lower than 6 eV, wherein said first isolation layer includes oxide or the material having energy gap greater than 7 eV, said dielectric spacer attached onto the sidewall of said second isolation layer are formed of oxide or the material having energy gap larger than 7 eV.

9. The nonvolatile memory of claim 7, wherein said first isolation layer is formed of oxide or the material having energy gap larger than 7 eV.

10. The nonvolatile memory of claim 7, wherein said dielectric spacer is formed of nitride or the material having energy gap lower than 6 eV.

11. The nonvolatile memory of claim 7, wherein said silicide material includes $TiSi_2$, $CoSi_2$ or NiSi.

12. The nonvolatile memory of claim 1, further comprising:
   double doped drain region adjacent to said source and drain regions, wherein p-n junctions of said double doped drain regions formed under said spacer trapping structure and the p-n junction of said double doped drain region is deeper than the one of said source and drain regions and said double doped drain region is closer to the channel under said gate structure than said source and drain regions and the doping concentration of said double doped drain region is lower than the one of said source and drain regions; and
   pocket ion implantation region adjacent to said double doped drain region, wherein the conductive type of the pocket ion implantation region is opposite to the one of the source and drain regions.

13. The nonvolatile memory of claim 12, wherein said spacer structure further comprises a second isolation layer formed between said first isolation layer and said dielectric spacer, said second isolation layer being formed of nitride or the material having energy gap lower than 6 eV, wherein first isolation layer including oxide or the material having energy gap greater than 7 eV, said dielectric attached onto the sidewall of said second isolation layer are formed of oxide or the material having energy gap larger than 7 eV.

14. The nonvolatile memory of claim 12, wherein said first isolation layer is formed of oxide or the material having energy gap larger than 7 eV.

15. The nonvolatile memory of claim 12, wherein said dielectric spacer is formed of nitride or the material having energy gap lower than 6 eV.

16. The nonvolatile memory of claim 12, wherein said silicide material includes $TiSi_2$, $CoSi_2$ or NiSi.

17. The nonvolatile memory of claim 1, wherein said spacer trapping structure further comprises a second isolation layer formed between said first isolation layer and said dielectric spacer, said second isolation layer being formed of nitride or the material having energy gap lower than 6 eV, said first isolation layer including oxide or the material having energy gap greater than 7 eV, said dielectric spacer attached onto the sidewall of said second isolation layer are formed of oxide or the material having energy gap larger than 7 eV.

18. The nonvolatile memory of claim 1, wherein said first isolation layer is formed of oxide or the material having energy gap larger than 7 eV.

19. The nonvolatile memory of claim 1, wherein said dielectric spacer is formed of nitride or the material having energy gap lower than 6 eV.

20. The nonvolatile memory of claim 1, wherein said silicide material includes $TiSi_2$, $CoSi_2$ or NiSi.

* * * * *

UNITED STATES PATENT AND TRADEMARK OFFICE
CERTIFICATE OF CORRECTION

PATENT NO. : 7,235,848 B2 Page 1 of 1
APPLICATION NO. : 10/731517
DATED : June 26, 2007
INVENTOR(S) : Jeng It is certified that error appears in the above-identified patent and that said Letters Patent is hereby corrected as shown below:

On the Title page, Item (56), under "Other Publications", in column 2, line 3, after "2006" delete ")".

On the Title page, Item (56), under "Other Publications", in column 2, line 6, after "2004" delete ")".

In column 2, line 28, delete "Salicide" and insert -- Silicide --, therefor.

In column 2, line 62, delete "WSi2" and insert -- $WSi_2$ --, therefor.

In column 5, line 38, delete "SiH4, NH3N2, N2O or SiH2Cl2, NH3N2, N2O" and insert -- $SiH_4$, $NH_3N_2$, $N_2O$ or $SiH_2Cl_2$, $NH_3N_2$, $N_2O$. --, therefor.

In column 5, line 51, delete "(0,1)" and insert -- (0, 1) --, therefor.

In column 6, line 10, delete "salicide" and insert -- silicide --, therefor.

Signed and Sealed this

Fourteenth Day of September, 2010

David J. Kappos
*Director of the United States Patent and Trademark Office*